United States Patent

[11] 3,631,297

[72] Inventor Arthur P. Conner
Dublin, Calif.

[21] Appl. No. 798,670
[22] Filed Feb. 12, 1969
[45] Patented Dec. 28, 1971
[73] Assignee Dynalectron Corporation
Washington, D.C.

[54] ANTIVIBRATION MOUNTING FOR CIRCUIT BOARDS
7 Claims, 3 Drawing Figs.

[52] U.S. Cl. .......... 317/101, 174/68.5, 206/65, 188/1
[51] Int. Cl. .......... H05k 1/04
[50] Field of Search .......... 317/101, 101 CM, 101 D, 101 CC, 99; 174/68.5, 52.6; 188/1 B; 206/65 F

[56] References Cited

UNITED STATES PATENTS

| | | | |
|---|---|---|---|
| 3,141,998 | 7/1964 | Silkman | 174/68.5 X |
| 3,324,974 | 6/1967 | Champlin et al. | 174/68.5 UX |
| 3,375,576 | 4/1968 | Klein et al. | 174/68.5 X |

*Primary Examiner*—David Smith, Jr.
*Attorney*—Owen, Wickersham & Erickson

ABSTRACT: A mounting for a large printed circuit board having a widespread number of short projections extending out from a surface to be supported. A slice of easily impressionable rigid foam plastic is sandwiched between the printed circuit board and a base of rigid metal. The projections are impressed into the plastic foam to provide retaining cavities, and a series of screws extend through said board at a margin closely adjacent its edge, extending through the foam and into the base.

PATENTED DEC 28 1971 3,631,297

INVENTOR:
ARTHUR P. CONNER

BY

Owen, Wickersham & Erickson
ATTORNEYS

ANTIVIBRATION MOUNTING FOR CIRCUIT BOARDS

This invention relates to the mounting of large printed circuit boards.

While small printed circuits have for some years been common, the use of large and very complex printed circuit boards is less known. For example, boards with an area in the order of 10 by 15 inches closely printed with circuits are employed in very complex circuits that before the days of integrated circuits, transistors, and printed circuits would have required the use of a whole series of large cabinets containing thousands of electronic components. The initial design of such a complex printed circuit is a costly and time-consuming procedure, but once the printed circuit has been designed and a master film made, the circuits are reproducible identically with a minimum of labor and expense, so that great savings can be achieved when a significant number of electronic devices incorporating such circuits are to be used.

The use of such large printed circuits is very advantageous over the use of a series of small printed circuits, because a series of small printed circuits must be connected together by wiring, requiring labor at the time of assembly and also requiring later checking; each point where additional work has to be done after the circuit is printed—whether the additional work be wiring or soldering or something else—is itself a significant source of trouble. Therefore, although the assembly of a series of small printed circuit boards might be an economical expedient for a single circuit or perhaps for two or three, it becomes important to have large printed circuit boards when complex circuits are to be reproduced in significant quantities.

One difficulty has heretofore discouraged the use of large printed circuit boards of such sizes as 10 by 15 inches and larger; namely, that such boards, while usable in stationary installations, have not been practical for installations where the board is subject to motion or vibration, such as an aircraft or space-vehicle installation as well as other instances wherein the devices are subject to movement, vibration, and abuse flowing from use in a moving vehicle or vibrated part. The problem has been so severe that such boards failed to meet the required tests because they were destroyed as circuits by resonant vibration, and there seemed to be no good way of preventing such vibration.

The problem has basically been one of support of the printed circuit board in such a way that the printed circuit board would not be able to vibrate, but heretofore the only support that could be achieved was on the edges of the boards. It is not practical to devise printed circuits with openings through the middle of the board, for this leads to many difficulties and greatly increases the eventual size of the circuit and the board. Support only at the edges was not sufficient, for the boards were commonly made of phenol formaldehyde resin or other suitable hard resin, and side support only tended to cause the "tin can" or "oil can" effect in which the board would swing sharply from a slightly concave position to a convex position, or vice versa. A single instance of such oil-canning would often be enough to destroy the usefulness of the printed circuit. Vibration led to many such swings and, as a result, when such boards were proposed to competent authorities for use in air and space vehicles, they were uniformly rejected.

The present invention presents a solution to this problem. It enables the use of large circuit boards with very much more detailed and complex circuits with the board fully supported without giving rise to any problem of short circuiting or any problem of "oil-canning" or vibration, even though the attaching screws are put in only at the edges of the board.

Basically, the invention relies on a novel cooperation between (a) the projections on the supported surface of the printed circuit, such as are made by solder joints of wires extending through the board from above, element-attaching screws, and, occasionally, such circuit elements as resistors as may be located on the supporting surface, though usually the circuits are designed to avoid the presence of such elements, and (b) a rigidly supported, impressionable, rigid foam. The foam receives all the projections from the supported surface of the board into itself, while the foam still insulates them from the metal plate below. Thereby, when the printed circuit board is attached by screws or bolts to the metal support, the rigid foam is sandwiched between and acts not only to insulate the board from the metal but also gives the board full support with vibration substantially impossible. In other words, each element projecting from the supported surface of the printed circuit board is pressed into the rigid foam to make a cavity exactly its own size; the board cannot move sideways because the foam around the cavities is too rigid to permit such movement, and this same mating of projections and cavities prevents up and down movement, so that the printed circuit board is retained in place during even severe vibration.

Other objects and advantages of the invention will appear from the following description of a preferred form of the invention.

Figures 1, 2:
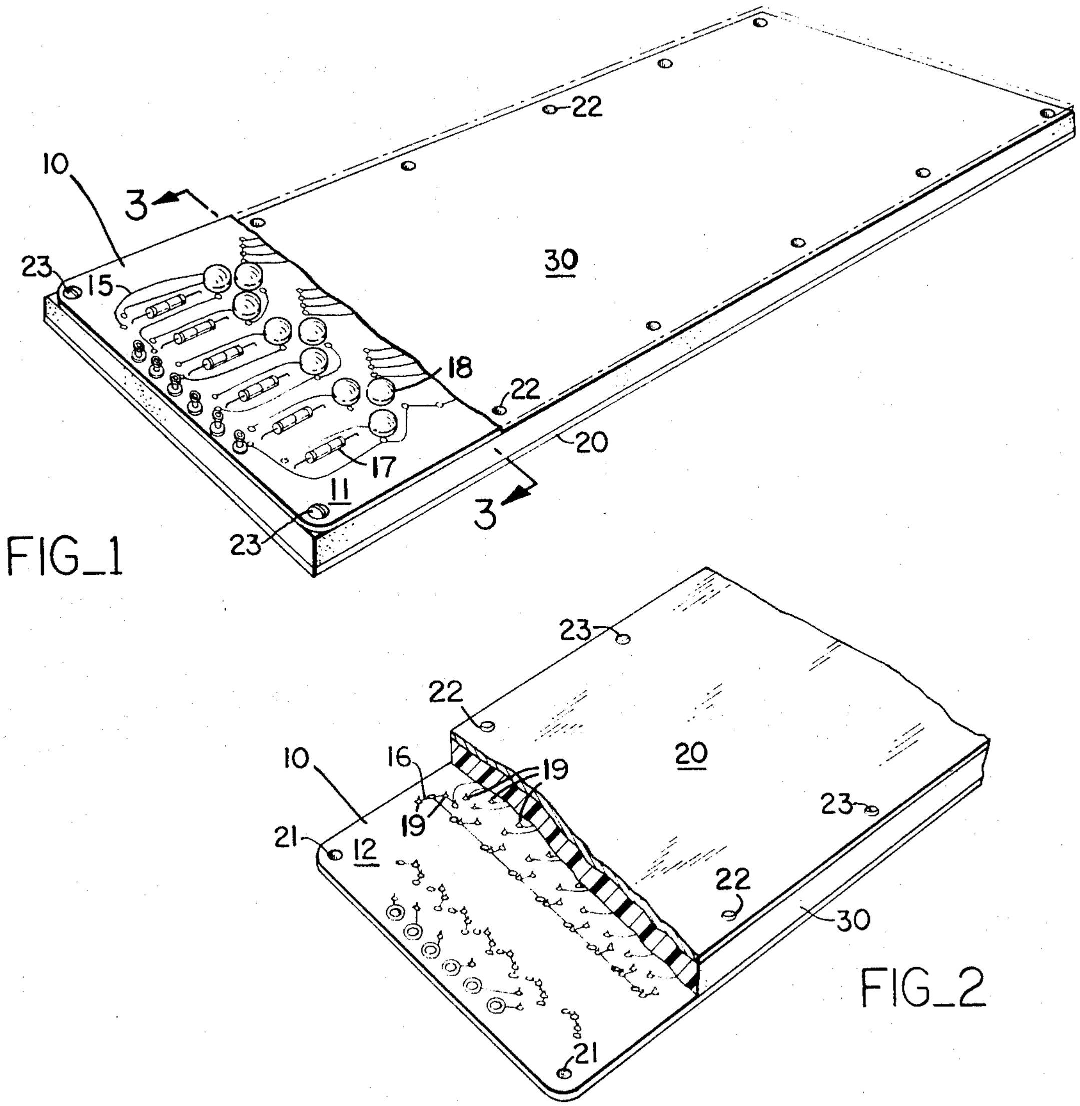
FIG. 1 is a view in perspective of an assembly of the present invention showing only the printed circuit and its support members, omitting some of the circuit components which are mounted on the printed circuit board in the complete installation. The printed circuit board is broken away to show the supporting rigid foam beneath.
FIG. 2 is a fragmentary perspective view of the assembly of FIG. 1 looking from the bottom. Here, the supporting members are broken away to show some of the supported surface of the printed circuit board of FIG. 1, showing a few of the many projections representing a large portion of the board.

In the installation such as that shown in the drawings, a large printed circuit board 10 is provided with many circuit components. Many of these have been omitted for the sake of illustration, since the exact circuit is not significant here. It is significant that the upper surface 11 and the lower surface 12 of the board 10 are both printed to provide on both surfaces a network of conductors that produce a desired result, but what the precise network is, is not significant here. The conductors 15 on the upper surface 11 and the conductors 16 on the lower surface 12 are different, but they cooperate, so that when components 17, 18 are mounted on the upper surface 11, their connecting wires 19 extend through to the lower surface 12 and are soldered there, both to hold the components 17, 18 in place and to connect the circuits on the two surfaces 11 and 12. Various circuit components 17, 18 are used, all or nearly all of them on the upper surface 11, so that there may be, for example, a series of integrated circuits, transistors, resistors, field effect transistors, capacitors, and so on. In addition to these, there may be sockets so that in the completed installation other components may be removably installed on the board and into the circuit. Some of these may be electron tubes, additional transistors, additional integrated circuits, coils, capacitors, and so on. The sockets have members extending through the board 10 with solder connections on the surface 12 that project below the surface 12.

Figure 3:
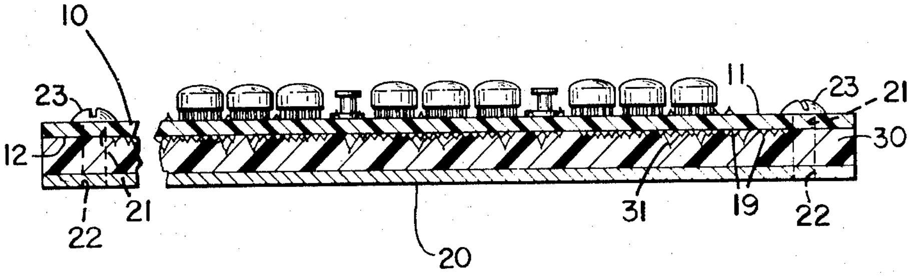
FIG. 3 is a view in section taken through the line 3—3 in FIG. 1.

As shown especially in FIGS. 2 and 3, the surface 12 which is to be supported, generally the bottom surface though that need not be so, is characterized by having a large number of such projections 19 which extend down typically one thirty-second to a little less than one-eighth of an inch below the surface 12. These projections 19 comprise the solder used to connect some of the circuit elements, some of the wires that are soldered (which are preferably extended clear through and beyond the solder so as not to run the risk of having them too short), and they also include mounting screws for some of the circuit elements and other things that may be on that lower surface, including occasionally small components such as resistors.

In this invention, advantage is taken of these projections 19 in providing a suitable mounting for the printed circuit board as a whole. A base 20 of metal, such as steel, is provided and a set of screw openings 21 on the printed circuit board 10 correspond to a similar set of openings 22 in the steel base 20, so that by threading screws 23 through, the board 10 may be affixed to the support 20. However, direct affixation, even if insulated, would allow the "oil can" effect spoken of above and would let the board 10 vibrate, because there would be no restraint sideways but only restraint at the edges.

The present invention employs in between the printed circuit board 10 and the support base 20 a layer 30 of rigid foam, such as rigid polystyrene foam or rigid polyurethane foam. It is important that the foam material be rigid rather than resilient, so that it holds any position to which it is forced and that it be impressionable rather than resilient or hard-surfaced, such as a phenol-formaldehyde resin is, so that by merely placing the printed circuit board 10 on the foam layer 30, and pressing the board 10 down, the projections 19, including the soldered joints, screw ends, and any circuit elements thereon, are forced into the foam 30 and indent the foam at many points 31,—each indentation being exactly the size of the projection 19 and forming a rigid encasement or enclosure thereof. The foam layer 30 should be somewhat thicker than the thickest maximum projection which is to be set into it, so that there will still be insulation between the printed circuit board 10 and the supporting base 20. Moreover, the thickness of the foam 30 should not be too thick, both in order to save space and to avoid introducing a measure of resiliency simply by having too thick a layer 30. About one-eighth to one-quarter inch has been found to be a generally preferable thickness. The layer 30 may be made by buying the material in the desired thickness or by buying it thicker and slicing it or by manufacturing it and then slicing it or by manufacturing it to the desired thickness.

In use, the printed circuit board 10 is placed on top of the rigid foam 30, which is placed on top of the supporting base 20 and with the screw holes 21 and 22 aligned, the screws 23 are inserted and the printed circuit board 10 tightened into place. This alone generally suffices to cause the needed indentation of the projections 19 into the foam 30, making the depressions 31, but if this is not sufficient, the installer may simply press down by hand on the center portions of the board 10 as, before, or after, he does the tightening of the screws 23, and the desired result will be achieved.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A compact sandwich mounting for a large printed circuit board having a widespread number of short projections extending out from a surface to be supported, comprising a base of rigid metal of substantially the configuration of the circuit board, a slice of easily impressionable rigid foam plastic which is between said board and said base, with said projections impressed into the plastic foam to provide transverse retaining cavities, and securing means holding said board to said base with the projections projecting into said foam.

2. The mounting of claim 1 wherein said securing means comprises a series of screws extending through said board at a margin closely adjacent its edge and extending through said foam and into said base.

3. The mounting of claim 1 wherein said rigid foam plastic is a sheet of rigid polystyrene foam.

4. The mounting of claim 1 wherein said rigid foam plastic is a sheet of rigid polyurethane foam.

5. A compact sandwich assembly for a large printed circuit board having circuit components mounted on one surface thereof and having attachment means extending through the board and affixed thereto by solder blobs that provide a widespread number of projections on the other surface, which is the surface to be supported, said printed circuit board having a series of screw openings located close to its edges, a base of rigid metal substantially the shape of the circuit board and having screw-receiving openings matching those on the printed circuit board, a slice of rigid foam plastic which is easily impressionable, of a greater thickness than the free space between the projections and the base located in between said board and said base, with said projections impressed firmly into the plastic foam and insulated by the plastic foam from said base while confined in cavities formed to substantially the size and shape of the projections in the plastic foam, and screws extending through the screw openings and screw receiving openings to hold the assembly firmly together at the edges of the printed circuit board while the slice of foam retains the portions against lateral movement by cooperation of the projections and cavities.

6. The mounting assembly of claim 5 wherein said slice is approximately one eighth inch thick sheet of rigid polystyrene.

7. The mounting assembly of claim 5 wherein said slice is an approximately one-eighth inch thick sheet of rigid polyurethane.

* * * * *